(12) United States Patent
Letertre et al.

(10) Patent No.: US 8,048,693 B2
(45) Date of Patent: Nov. 1, 2011

(54) METHODS AND STRUCTURES FOR RELAXATION OF STRAINED LAYERS

(75) Inventors: Fabrice Letertre, Meylan (FR); Carlos Mazure, Bernin (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 261 days.

(21) Appl. No.: 12/341,722

(22) Filed: Dec. 22, 2008

(65) Prior Publication Data

US 2010/0032805 A1 Feb. 11, 2010

(30) Foreign Application Priority Data

Aug. 6, 2008 (EP) .................................... 08290757

(51) Int. Cl.
*H01L 21/00* (2006.01)

(52) U.S. Cl. ............ 438/22; 438/62; 438/455; 438/974; 257/E21.213; 257/E29.089

(58) Field of Classification Search .............. 438/22–49, 438/455–458, 761, 795; 257/49, 75, 615, 257/E21.213, E29.089, E33.026
See application file for complete search history.

(56) References Cited

U.S. PATENT DOCUMENTS

| | | | | |
|---|---|---|---|---|
| 4,994,867 A | | 2/1991 | Biegelsen | 357/16 |
| 5,391,257 A | | 2/1995 | Sullivan et al. | 156/630 |
| 5,670,411 A | * | 9/1997 | Yonehara et al. | 438/459 |
| 5,965,939 A | * | 10/1999 | Kim et al. | 257/752 |
| 6,214,733 B1 | | 4/2001 | Sickmiller | 438/691 |
| 6,406,795 B1 | | 6/2002 | Hwang et al. | 428/457 |
| 6,794,276 B2 | | 9/2004 | Letertre et al. | 438/506 |
| 7,018,909 B2 | | 3/2006 | Ghyselen et al. | 438/455 |
| 7,273,798 B2 | | 9/2007 | Lester et al. | 438/458 |
| 7,282,381 B2 | | 10/2007 | Feltin et al. | 438/46 |
| 7,585,792 B2 | | 9/2009 | Celler | 438/795 |
| 7,736,935 B2 | | 6/2010 | Faure et al. | 438/59 |
| 2003/0064535 A1 | | 4/2003 | Kub et al. | 438/22 |
| 2004/0192067 A1 | | 9/2004 | Ghyselen et al. | 428/763 |
| 2004/0253792 A1 | | 12/2004 | Cohen et al. | 438/400 |
| 2005/0250294 A1 | | 11/2005 | Ghyselen et al. | 438/458 |
| 2006/0094140 A1 | | 5/2006 | Inoguchi et al. | 438/22 |
| 2006/0128117 A1 | * | 6/2006 | Ghyselen et al. | 438/455 |
| 2006/0175608 A1 | | 8/2006 | Celler | 257/49 |

(Continued)

FOREIGN PATENT DOCUMENTS

EP 0651439 5/1995

(Continued)

OTHER PUBLICATIONS

Notice of Allowance dated Feb. 24, 2010, U.S. Appl. No. 12/341,806, filed Dec. 22, 2008.

(Continued)

*Primary Examiner* — Charles Garber
*Assistant Examiner* — Abdulfattah Mustapha
(74) *Attorney, Agent, or Firm* — Winston & Strawn LLP

(57) ABSTRACT

The present invention provides methods for relaxing a strained-material layer and structures produced by the methods. Briefly, the methods include depositing a first low-viscosity layer that includes a first compliant material on the strained-material layer, depositing a second low-viscosity layer that includes a second compliant material on the strained-material layer to form a first sandwiched structure and subjecting the first sandwiched structure to a heat treatment such that the reflow of the first and the second low-viscosity layers permits the strained-material layer to at least partly relax.

16 Claims, 2 Drawing Sheets

U.S. PATENT DOCUMENTS

| | | | |
|---|---|---|---|
| 2006/0205180 A1 | 9/2006 | Henley et al. | 438/458 |
| 2006/0211219 A1 | 9/2006 | Henley et al. | 438/458 |
| 2007/0048975 A1 | 3/2007 | Chen et al. | 438/478 |
| 2007/0069225 A1* | 3/2007 | Krames et al. | 257/94 |
| 2007/0072324 A1 | 3/2007 | Krames et al. | 438/46 |
| 2007/0241353 A1 | 10/2007 | Taki | 257/94 |
| 2007/0278622 A1 | 12/2007 | Lester et al. | 257/615 |
| 2007/0298549 A1 | 12/2007 | Jurczak et al. | 438/149 |
| 2008/0113496 A1 | 5/2008 | Keller et al. | 438/481 |
| 2008/0169483 A1 | 7/2008 | Kasai et al. | 257/183 |
| 2009/0050917 A1 | 2/2009 | Nakagawa et al. | 257/98 |
| 2009/0261344 A1 | 10/2009 | Celler | 438/79 |
| 2010/0032793 A1 | 2/2010 | Guenard et al. | 257/507 |

FOREIGN PATENT DOCUMENTS

| | | |
|---|---|---|
| EP | 0 858 110 A1 | 8/1998 |
| EP | 1378591 A1 | 1/2004 |
| EP | 1 671 361 B1 | 4/2007 |
| EP | 1901345 | 3/2008 |
| FR | 2775121 | 8/1999 |
| FR | 2895420 | 6/2007 |
| FR | 2895562 | 6/2007 |
| WO | WO 2004/077552 | 9/2004 |

OTHER PUBLICATIONS

Feng et al., "Stress Generation and Relaxation during Film Heteroepitaxy on a Compliant Substrate with a Viscoelastic Glass Interlayer," Mat. Res. Soc. Symp. Proc., 696:N3.19.1-N3.19.6 (2002).

Hansen et al., "Development of a glass-bonded compliant substrate," Journal of Crystal Growth, 195:144-150 (1998).

Moran et al., "Kinetics of Strain Relaxation in Semiconductor Films Grown on Borosilicate Glass-Bonded Substrates," Journal of Electronic Materials, 30(7):802-806 (2001).

European Search Report for EP08290757.7 dated Mar. 16, 2009.

Haizhou Yin et al., "Fully-depleted Strained-Si on Insulator NMOSFETs without Relaxed SiGe Buffers", IEDM International Electron Devices Meeting, , pp. 03-53-03-56 (2003).

C. X. Peng et al., "Influence of GaN polarity and intermediate-temperature buffer layers on strain relaxation and defects", Physica Bvol. 391, No. 1, pp. 6-11 (2007).

European Search Report for EP 08 29 0759 dated Apr. 14, 2009.

Hobart, K.D. et al., "Compliant Substrates: A Comparative Study of the Relaxation Mechanisms of Strained Films Bonded to High and Low Viscosity Oxides", Journal of Electronic Materials, vol. 29, No. 7, pp. 897-900 (2000).

L. Di Cioccio et al., "III-V Layer Transfer Onto Silicon and Applications", Phys. Stat. Sol., vol. (a) 202, No. 4, pp. 509-515 (2005).

M. Kostrzewa et al, "Feasibility of Strain Relaxed InAsP and InGaAs Compliant Substrates", pp. 437-440 (2003).

P. M. Mooney et al., "Elastic Strain Relaxation in Free-Standing SiGe/Si Structures", Applied Physics Letters, vol. 84, No. 7, pp. 1093-1095 (2004).

Haizhou Yin et al., "Buckling Suppression of SiGe Islands on Compliant Substrates", Journal of Applied Physics, vol. 94, No. 10, pp. 6875-6882 (2003).

Haizhou Yin et al., "Strain Relaxation of SiGe Islands on Compliant Oxide", Journal of Applied Physics, vol. 91, No. 12, pp. 9716-9722 (2002).

International Search Report, PCT/EP2009/004790, mailed Sep. 23, 2009.

U.S. Appl. No. 13/055,123, filed Jan. 20, 2011.
U.S. Appl. No. 13/056,572, filed Jan. 28, 2011.

* cited by examiner

METHODS AND STRUCTURES FOR RELAXATION OF STRAINED LAYERS

FIELD OF INVENTION

The present invention relates to the semiconductor materials processing, and in particular to methods and structures for relaxing layers of materials grown in a strained state, the layers, when relaxed, being useful for fabrication of electronic, opto-electronic, and photovoltaic devices. More particularly, the invention related to relaxation of strained heteroepitaxial films by compliant substrates.

BACKGROUND OF THE INVENTION

The growth of thin films on substrates by hetero-epitaxy is an important manufacturing step in the semiconductor technology. For instance, when native bulk substrates are not available or are too expensive, useful materials are often formed by hetero-epitaxy on seed substrates. Materials grown by hetero-epitaxy have numerous uses. For example, after transfer of the hetero-epitaxial films to another substrate these films can, for instance, be used for epitaxial growth of layers used in electronic and opto-electronic, photovoltaic applications. In the field of light-emitting semiconductor devices or solar cells there is a need to grow heteroepitaxial films of Group III-nitride materials on such substrates as sapphire or SiC.

However, when materials are grown by hetero-epitaxy on substrates on substrates that have lattice constants and coefficients of thermal expansion that are different from the materials being grown, material quality can be compromised by misfit compressive strain leading to generation of dislocations and cracks. Consequently, thin hetero-epitaxial films that are strained due to lattice-parameter misfit can further deteriorate during subsequent steps. Also, films of materials formed by hetero-epitaxy can be grown to only a limited thickness if cracks and dislocations are to be avoided.

However, presently methods used to relax strained hetero-epitaxial films often do not lead to complete lateral relaxation and accordingly do not adequately suppress buckling, the formation of cracks, etc. A method leading to complete or almost complete relaxation of a strained layer formed above a substrate or at least a method that avoids or alleviates the above-mentioned defects would be a useful addition to the art.

SUMMARY OF THE INVENTION

The present invention provides methods and structures leading to improved relaxation of strained layers. In preferred embodiments, the methods of this invention include, first, forming a first "sandwich" structure of semiconductor materials in which a layer of a strained-material is sandwiched between two layers of a low-viscosity compliant material. The first sandwich structure can be formed by depositing a first low-viscosity layer of a first compliant material on one face of the strained-material layer, then depositing a second low-viscosity layer of a second compliant material on the other face of the strained-material layer. Next the sandwich structure is thermally treated so that the low-viscosity material layers can reflow (or flow) so that the strained-material layer is at least partly relaxed. The provision of low-viscosity layers on both sides of the strained-material layer allows displacement of strained-material layer and, in particular, complete relaxation, if it is desired, without the formation of defects. The degree of relaxation can be controlled by appropriate choices of the low-viscosity compliant materials and of the temperature and duration of the heat treatment process.

A preferred embodiment of the method includes growing the strained-material layer on a seed substrate; depositing a first low-viscosity layer on one exposed face of the strained-material layer; bonding a first substrate to the first low-viscosity layer; detaching the strained-material layer, the first low-viscosity layer, and the first substrate from the seed substrate; depositing a second low-viscosity layer on other now-exposed face of the strained-material layer; bonding a second substrate to the second low-viscosity layer so as to form a second sandwich structure; and subjecting the second sandwich structure to heat treatment sufficient to cause reflow of one or both the first and the second low-viscosity layers so as to at least partly relax the strained-material layer within the second sandwich structure.

The invention also relates to a method for the manufacture of semiconductor substrates suitable for the fabrication of LED devices, laser devices, or photovoltaic field devices, the method comprising forming a layer of an at least partially relaxed strained material according to the methods described herein; exposing at least a portion of the layer of partially relaxed strained material; and growing epitaxially on the exposed portion of the at least partially relaxed strained material layer a further layer comprising a semiconductor material suitable for the fabrication of one or more LED devices, laser devices, and photovoltaic field devices.

The structures disclosed herein form additional embodiments of the invention. A particularly preferred semiconductor structure according to the invention comprises an at least partially relaxed layer of strained InGaN; two low-viscosity layers, one layer on each face of the InGaN; and two substrates, one substrate bonded to each of the low-viscosity layers. In this structure, the at least partially relaxed layer of strained InGaN is advantageously arranged in a plurality of islands separated by trenches, and one or both of the low-viscosity layers comprises sapphire.

Additional features and advantages of the present invention will be described with reference to the drawings. In the description, reference is made to the accompanying figures that are meant to illustrate preferred embodiments of the invention. It is understood that such embodiments do not represent the full scope of the invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1:
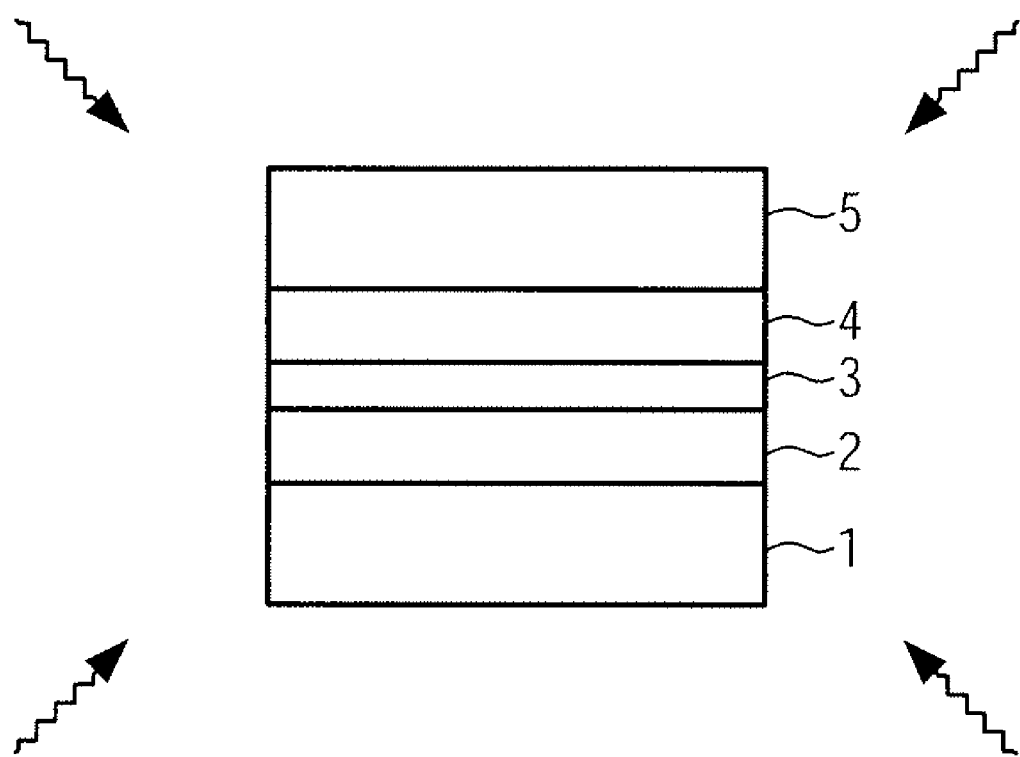
FIG. 1 illustrates a structure of the invention being subjected to a heat treatment.

It is important to understand that the term "low-viscosity" material (or "low-viscosity compliant" material, or so forth) is used herein to indicate a material that is compliant and deformable layer during a specific heat treatment. For example, such a material can be an amorphous material, and the specific heat treatment can at least in part occur above the glass transition temperature (Tg) of the amorphous material. It is well known that above Tg, an amorphous material becomes deformable (e.g., plastically deformable) and can to some extend flow or reflow (e.g., viscous fluid flow).

In further preferred embodiments, a second sandwich structure of semiconductor materials can be formed from the first sandwich structure by bonding one or more substrates to one or both of the low-viscosity layers before heat treatment. For example, a first substrate can be bonded to one of the first or the second low-viscosity layers before the heat treatment step. If the strained-material layer was hetero-epitaxially grown on a seed substrate, this first substrate can advantageously be used to transfer the strained-material layer from the seed substrate. A second substrate can also be bonded to the other one of the first and the second low-viscosity layers before the heat treatment step so that a structure is formed that includes both substrates, both low-viscosity layers and the strained-material layer. Such a structure is referred to herein as a "second sandwiched structure". The first and the second substrates can include, e.g., sapphire, Si, SiC, or the like.

The second sandwiched structure advantageously limits or prevents buckling of the strained-material layer during the relaxation heat treatment. The first and the second substrates act as highly rigid mechanical stiffeners that suppress or significantly reduce surface buckling while allowing mainly lateral relaxation of the strained-material layer. Dilatation of the substrates during the heat treatment may also participate to the relaxation of the strained-material.

Preferably, the first and the second substrates are made of the same material or at least of materials of similar coefficients of thermal expansion in order to avoid a risk that the second sandwiched structure could crack, split, break, or disassemble during the heat treatment due to a significantly different expansion on both sides of the strained-material layer. The materials and the thicknesses of the substrates are preferably chosen in view of any mismatch between coefficients of thermal expansion so that the second sandwiched structure is mechanically stable at the reflow temperature. The coefficients of thermal expansion of substrates at the reflow temperature should differ by not more than 20%, preferably by not more than 10%, and even more preferably by not more than 5%. For example, the first and second substrates may be chosen from the couple of Si/SiC, GaAs/Ge, SiC/AlN or GaN/AlN.

In further preferred embodiments, at least one surface of the strained-material layer can be exposed after the heat treatment step by detaching at least one of the first and second substrates from the low-viscosity layer to which it is bonded. This exposed surface can subsequently be used for the further processing, e.g., for epitaxial growth of another layer useful for the manufacture of electronic or opto-electronic semiconductor devices or solar cells. Also, to facilitate substrate detachment after the heat treatment by laser lift off as known in the art, the first and/or second low-viscosity layer can comprise an absorption layer suitable for absorbing electromagnetic radiation. The absorption layer can comprise, e.g., SiN or other nitride compounds. The absorption layer of the first (or second) low-viscosity layer can preferably be arranged at the interface of the first (or second) low-viscosity layer and the first (or second) substrate in order to avoid damage to the at least partly relaxed strained-material layer.

For example, when the strained-material layer comprises a polar Group III-nitride material, e.g., InGaN or c-plane InGaN that are useful for the production of LEDs and solar cells, either polar face can be exposed by the detachment of a suitable one of the first or the second substrate. Thus, the Group III-polarity face, i.e., the Ga face, of InGaN material can be exposed after relaxation.

In further preferred embodiments, the strained-material layer can be patterned (e.g., by etching) before heat treatment so as to form strained-material islands separated by interspaces, the interspaces acting to further facilitate relaxation of the strained-material. The strained-material islands can be of any shape, but, for ease of manufacture, are preferably chosen to be circular, square, or the like. Because low-viscosity layers are on both sides of the strained layer, the lateral dimensions of the islands can be significantly larger, e.g., from 0.1 to 0.5 mm or larger, than known in the prior art without strongly affecting relaxation. For example, the strained material layer can be patterned so as to form separated islands of strained-material at least a majority of which have lateral dimensions larger than 0.5 mm. In the following, the term "strained-material" is used to refer both to the strained-material layer and to the islands formed from the strained-material layer.

For example, the strained-material layer can be patterned before depositing the second low-viscosity layer on the strained-material layer, or alternatively, both the strained-material layer and the second low-viscosity layer can both be patterned after deposition of the second low-viscosity layer. In the first alternative, the strained-material islands can be formed after the first substrate is bonded to the first low-viscosity layer and the strained-material layer but before the second low-viscosity layer is deposited on the strained-material. In the second alternative, trenches (interspaces or patterns) can be formed through both the second low-viscosity layer (after its deposition) and the strained-material layer, with the second substrate being bonded so as to preserve the islands structures and interspaces. The first low-viscosity layer may also be partially or completely etched.

Preferably, the first and/or the second low-viscosity layers comprise compositions of $SiO_2$, with one or more of boron or phosphorous, e.g., a borosilicate glass or a borophosphosilicate glass (BPSG), and the heat treatment can advantageously be performed at a temperature above the Tg of such materials. For example, the heat treatment can at least from 800 to 850° C. Heat treatment at higher temperatures, e.g., from 850° C. to 950° C., in particular, from 900° C. to 950° C., can be used to cause more rapid reflow (or flow) of the low-viscosity compliant material. The strained-material layer will not be damaged even at such high temperatures, since it is capped and shielded by the first and second substrates. Reflow (or flow or plastic deformation) can also be more rapid when the first or second low-viscosity layers comprise an amount of boron chosen so that reflow is sufficiently rapid at higher treatment temperatures, e.g., from 850° C. up to 950° C., but not so high that mechanical rigidity is compromised at the lower temperatures, e.g., about 800° C. or lower, used in subsequent processing. A boron content that is less than about 5% by weight and preferably less than 4% by weight has been found suitable. Also, the first or second low-viscosity layers comprise can comprise phosphorous at between 1 to 3% by weight, preferably between 2 to 3% by weight.

Alternatively, the first or second low-viscosity layers can also be formed as buried oxide layers each being a compliant material layer. Also, an $SiO_2$ layer or undoped silicon glass or a SiN layer may be deposited on the strained-material layer in order to enhance the adherence of the low-viscosity layer to the strained-material layer.

In particularly useful embodiments, a strained layer of a semiconductor material can be hetero-epitaxially grown on a seed substrate, in particular, a massive or composite seed substrate (e.g., sapphire with a thin GaN surface layer). The strained layer can then be detached from the seed substrate and bonded to the first low-viscosity compliant layer already on the surface of the first. The second low-viscosity layer can then be deposited on the strained-material layer and the second substrate bonded to the second low-viscosity compliant layer. The strained layer can be detached from the seed substrate by SMART CUT® technology, etching, laser lift off technique or other suitable method. Thus, a hetero-epitaxially grown strained-material layer that was transferred to the first substrate can efficiently be relaxed in accordance with the present invention.

The present invention for relaxing a strained-material layer in an elastic relaxation mode with substantially no buckling can advantageously be used for the production of semiconductor device for electronic, photovoltaic or opto-electronic applications. In particular, a sandwich structure with an at least partially relaxed semiconductor material layer can be provided as previously described, and then one of the first or second substrate along with their associated low-viscosity layer can be removed. A layer of a further material useful for the fabrication of semiconductor devices can that be epitaxially or homo-epitaxially grown on the now exposed face of the at least partially relaxed strained-material, (e.g., on the faces of the at least partially relaxed strained-material islands).

It should be understood that Group III-nitride materials, e.g., InGaN, are used here only as examples and without limitation. In fact, the present invention can be usefully applied to strained-material that comprise binary, ternary quaternary alloys that are polar, semi-polar, or non-polar.

U.S. patent application Ser. No. 12/341,806, titled "PASSIVATION OF SEMICONDUCTOR STRUCTURES HAVING STRAINED LAYERS", by Bruce FAURE and Pascal GUENARD, and assigned to the assignee of the present application is incorporated herein by reference in its entirety for all purposes.

U.S. patent application Ser. No. 12/341,852, titled "METHODS FOR RELAXATION AND TRANSFER OF STRAINED LAYERS AND STRUCTURES FABRICATED THEREBY", by Pascal GUENARD, Bruce FAURE, Fabrice LETERTRE, Michael R. KRAMES, and Nathan F. GARDNER, and assigned to the assignee of the present application is incorporated herein by reference in its entirety for all purposes.

FIG. 1 illustrates multilayer stack 7, an example of an embodiment of the sandwich structures of the present invention. The sandwich structure has already been formed and is illustrated as being subjected to heat treatment (indicated by the four wavy arrows in this figure and also in FIGS. 2 and 3). The sandwiched structure comprises a first substrate 1, a first low-viscosity compliant layer 2, a strained-material layer 3, a second low-viscosity compliant layer 4 and a second substrate 5. The two low-viscosity compliant preferably comprise a borophosphosilicate glass. Thus, in particular, strained-material layer 3 is sandwiched by two low-viscosity compliant borophosphosilicate glass layers 2 and 4.

The two low-viscosity compliant borophosphosilicate glass layers 2 and 4 allow for reliable complete elastic relaxation of strained-material layer 3, and the two substrates, which in the present example may be sapphire substrates, act as stiffeners to avoid any significant buckling of strained-material layer 3.

For example, strained-material layer 3 can comprise a c-plane InGaN film that was hetero-epitaxially grown on a GaN seed layer which was deposited on some support substrate, and was then transferred to first substrate 1 by means of first borophosphosilicate glass layer 2. The InGaN film can comprise from 0.5 to 30% molar indium and the thickness of the InGaN film may be chosen from 10 to 300 nm. Preferably, the InGaN film comprises about 5-7% of molar indium and has a thickness of the film of about 100 nm.

In order to enhance the adherence between the strained-material layer 3 and the first borophosphosilicate glass layer 2 an $SiO_2$ or SiN layer of a thickness of 10-100 nm may be deposited on the strained-material layer 3, e.g., the InGaN film, before deposition of the first borophosphosilicate glass layer 2. After transfer to the first substrate 1 the second borophosphosilicate glass layer 4 is deposited on the free surface of the strained-material layer 3, i.e. on the N face of the InGaN film. Again, an SiN or $SiO_2$ film may be formed on the N face of the InGaN film before deposition of the second borophosphosilicate glass layer 4 in order to improve adherence. On the Ga face of the InGaN film, an $SiO_2$ layer is preferred, while on the N face, an SiN film is preferred. The second substrate was bonded to the second borophosphosilicate glass layer 4.

Both borophosphosilicate glass layers are preferably formed of the closely similar materials to avoid stresses or other asymmetric influences on the strained-material layer 3 caused by different reflow properties during the heat treatment. A preferred borophosphosilicate glass composition for layers 2 and 4 preferably comprises 4-5% by weight of boron so that a sufficiently high reflow (plastic deformation) can be achieved during the heat treatment at temperatures above 850° C. but concurrently a sufficient rigidity is provided at temperatures that are involved in the epitaxial growth, e.g., about 800° C. Both borophosphosilicate class layer can have thicknesses of 0.5 micrometer up to a few micrometers. The greater the thicknesses of the respective borophosphosilicate glass layers 2 and 4 are chosen, the faster the relaxation of the strained-material layer 3 will be achieved.

The sandwiched structure shown in FIG. 1 is being annealed at a temperature of about 800° C. to 950° C. Fast reflow of the compliant material is expected at such high temperatures which can be employed since the InGaN film is protected from damage by the first and second substrates 1 and 5.

Consider, for instance, a 1% strained InGaN film (i.e. a lattice mismatch between the grown InGaN film and the GaN seed layer on which it was grown of about 1%). For this case, a sample of 1 mm$^2$ has to laterally extend 10 micrometers in total in order to arrive at a completely relaxed state. This can be achieved by heat treatment of the sandwiched structure shown in FIG. 1 at temperatures exceeding 850° C. without causing significant buckling of the relaxed strained-material layer 3.

Figure 2:
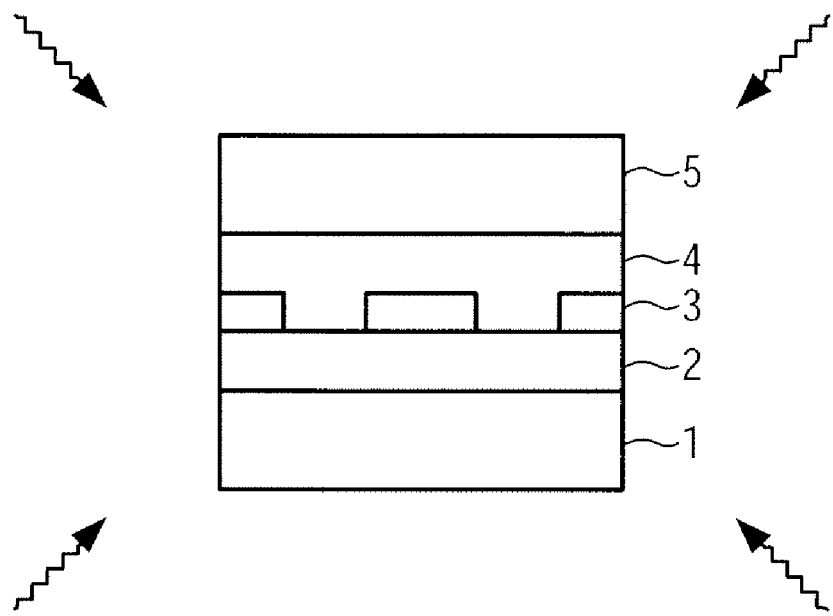
FIG. 2 illustrates a further structure of the invention being subjected to a heat treatment.

According to other embodiments, the strained-material layer 3 is patterned by etching trenches (interspaces) in the layer thereby forming partially or fully isolated islands of the strained-material. FIG. 2 illustrates multilayer stack 8, an example of such an embodiment of a sandwich structure of the present invention, which is being subjected to heat treatment. Strained-material layer 3, which was continuous in FIG. 1, has here been etched to form trenches 6 before deposition of the second borophosphosilicate glass layer 4. After deposition of the second borophosphosilicate glass layer 4 on strained-material 3, it the largely or completely fills trenches 6. Apart from this patterning step (e.g., by etching) of strained-material layer 3, the manufacture of sandwiched structure 8 is substantially similar to the manufacture of sandwiched structure 7 of FIG. 1.

FIG. 1 illustrates multilayer stack 7, an example of an embodiment of a sandwich structure of the present invention.

Figure 3:
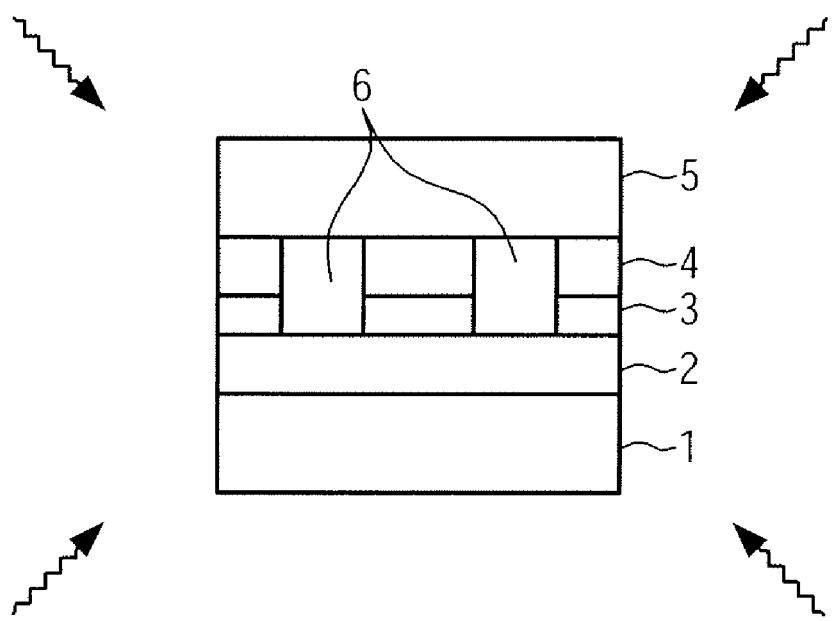
FIG. 3 illustrates a further structure of the invention being subjected to a heat treatment.

FIG. 3 illustrates multilayer stack 9, an example of a further embodiment comprising a strained-material layer, which is also being subjected to heat treatment. In this sandwich structure, the second borophosphosilicate glass layer 4 was deposited on the continuous strained-material layer 3 of FIG. 1, and subsequently both the second borophosphosilicate glass layer 4 and the strained-material layer 3 was patterned by etching trenches or interspaces 6. The borophosphosilicate glass layer 2 may also be partially or completely etched depending on the ability of the strained-material to relax. Apart from this patterning step of strained-material layer 3, the manufacture of sandwiched structure 8 is substantially similar to the manufacture of sandwiched structure 7 of FIG. 1. Compared to the embodiment shown in FIG. 2 relaxation of the strained-material islands 3 is not hindered by material of the second borophosphosilicate glass layer 4 that was deposited in trenches 6.

After heat treatment and the relaxation of the strained-material layer 3 of FIG. 1 or the strained-material islands 3 of FIGS. 2 and 3, i.e. after termination of the heat treatment and cool down of the sandwiched structure, the first substrate 1 and the first borophosphosilicate glass layer 2 can be detached in order to expose the Ga face of the relaxed strained InGaN film (islands) that can be used for further (homo) epitaxial growth of an InGaN layer, for example. Alternatively, the N face could be exposed. The further InGaN material can have (approximately) the same indium content as the relaxed strained-material 3 of FIGS. 1 to 3. Depending on the crystalline quality of the InGaN seed layer, the further layers can have dislocation densities of about $5 \cdot 10^5$ to $5 \cdot 10^9$ cm$^2$ with thicknesses of 1 to 3 micrometers can be obtained.

According to an alternative embodiment different from the embodiment shown in FIG. 3, trenches in both layers 2 and 4 might be provided and even be preferred in view of the relaxation step. It also possible to partially etch the second borophosphosilicate glass layer 2.

The preferred embodiments of the invention described above do not limit the scope of the invention, since these embodiments are illustrations of several preferred aspects of the invention. Indeed, the various modifications of the invention in addition to those shown and described herein, such as alternate useful combinations of the elements described apparent to those skilled in the art, are also intended to fall within the scope of the invention. In the following (and in the application as a whole), headings and legends are used for clarity and convenience only. The words "including", "comprising", "having", and "with" as used herein are to be interpreted broadly and comprehensively and are not limited to any physical interconnection. The articles "a" or "an" or the like are also to be interpreted broadly and comprehensively as referring to both the singular and the plural. A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method for relaxing a layer of a strained material comprising:
   growing the strained-material layer on a seed substrate;
   depositing a first low-viscosity layer on one exposed face of the strained-material layer;
   bonding a first substrate to the first low-viscosity layer;
   detaching the strained-material layer, the first low-viscosity layer, and the first substrate from the seed substrate;
   depositing a second low-viscosity layer on other now-exposed face of the strained-material layer;
   bonding a second substrate to the second low-viscosity layer so as to form a sandwich structure; and
   subjecting the sandwich structure to heat treatment at a temperature of between 800° C. and 950° C. to cause reflow of one or both of the first and the second low-viscosity layers so as to at least partly relax the strained-material layer within the sandwich structure.

2. A method for the manufacture of semiconductor substrates suitable for the fabrication of LED devices, laser devices, or photovoltaic field devices, the method comprising:
   forming a layer of an at least partially relaxed strained material according to the method of claim 1;
   exposing at least a portion of the layer of partially relaxed strained material; and
   growing epitaxially on the exposed portion of the at least partially relaxed strained material layer a further layer comprising a semiconductor material suitable for the fabrication of one or more LED devices, laser devices, and photovoltaic field devices.

3. The method according to claim 2, wherein the at least partially relaxed layer of strained material comprises a polar Group III-nitride material, and wherein at least portions of the exposed face of the further layer have Group III polarity.

4. The method of claim 1, wherein the material of the strained-material layer of the sandwich structure is strained InGaN.

5. The method of claim 4, wherein the at least partially relaxed layer of strained InGaN is arranged in a plurality of islands separated by trenches.

6. The method of claim 4, which further comprises bonding a substrate to each low viscosity layer of the sandwich structure.

7. The method of claim 6, wherein either or both substrates are sapphire or silicon.

8. The method of claim 1, wherein the first and the second substrates have coefficients of thermal expansion that differ from each other by less than 10%.

9. The method of claim 1, further comprising, before performing the heat treatment, patterning the strained-material layer so as to form separated islands of strained-material at least a majority of which have lateral dimensions larger than 0.25 mm$^2$.

10. The method of claim 9, wherein the patterning is performed prior to depositing the second low-viscosity layer.

11. The method of claim 9, wherein the patterning is performed subsequent to depositing the second low-viscosity layer on the strained-material layer, and wherein both the strained-material layer and the second low-viscosity layer are jointly patterned.

12. The method of claim 1, wherein the strained-material layer comprises a Group III-nitride material or an alloy or mixture thereof.

13. The method of claim 1, wherein the one or both of the low-viscosity layers comprise a composition or mixture including $SiO_2$ and one or both of boron and phosphorous.

14. The method of claim 13, wherein the composition comprises less than 5% by weight of boron.

15. The method of claim 1 wherein at least a portion of the heat treatment is performed at a temperature of less than 850° C.

16. The method of claim 1, wherein one or both of the low-viscosity layers comprise an absorption layer suitable for promoting the detachment of a substrate bonded thereto.

* * * * *

UNITED STATES PATENT AND TRADEMARK OFFICE
CERTIFICATE OF CORRECTION

PATENT NO. : 8,048,693 B2
APPLICATION NO. : 12/341722
DATED : November 1, 2011
INVENTOR(S) : Letertre et al.

It is certified that error appears in the above-identified patent and that said Letters Patent is hereby corrected as shown below:

Title Page:
Item (73) Assignee, change "S.O.I. Tec" to -- S.O.I.Tec --. The name of the Assignee will then correctly appear as "S.O.I.Tec Silicon on Insulator Technologies".

Item (56) References Cited, OTHER PUBLICATIONS, add the following documents:

Haizhou Yin et al., "Tunable Uniaxial vs Biaxial In-Plane Strain Using Compliant Substrates,"
    Applied Physics Letters, Vol. 87, pp. 061922-1 - 061922-3 (2005).
  R. Huang et al., "Mechanics of Relaxing SiGe Islands on a Viscous Glass," Acta Mechanica
    Sinica (English Series), Vol. 18, No. 5, pp. 441-456 (2002).

Signed and Sealed this
Third Day of January, 2012

David J. Kappos
*Director of the United States Patent and Trademark Office*